US010762966B2

United States Patent
Cai et al.

(10) Patent No.: US 10,762,966 B2
(45) Date of Patent: Sep. 1, 2020

(54) MEMORY ARRAYS AND METHODS OF FORMING THE SAME

(71) Applicant: GLOBALFOUNDRIES Singapore Pte. Ltd., Singapore (SG)

(72) Inventors: Xinshu Cai, Singapore (SG); Shyue Seng Tan, Singapore (SG); Kiok Boone Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 46 days.

(21) Appl. No.: 16/174,318

(22) Filed: Oct. 30, 2018

(65) Prior Publication Data
US 2020/0135275 A1    Apr. 30, 2020

(51) Int. Cl.
G11C 11/34 (2006.01)
G11C 16/10 (2006.01)
G11C 16/14 (2006.01)
G11C 16/04 (2006.01)
H01L 27/11521 (2017.01)

(52) U.S. Cl.
CPC .......... *G11C 16/10* (2013.01); *G11C 16/0425* (2013.01); *G11C 16/14* (2013.01); *H01L 27/11521* (2013.01)

(58) Field of Classification Search
CPC ..... G11C 16/10; G11C 16/0425; G11C 16/14; H01L 27/11521
See application file for complete search history.

(56) References Cited

U.S. PATENT DOCUMENTS

| 6,747,310 | B2 | 6/2004 | Fan et al. | |
|---|---|---|---|---|
| 8,530,310 | B2* | 9/2013 | Teo | B82Y 10/00 438/267 |
| 8,647,946 | B2* | 2/2014 | Tan | B82Y 10/00 438/261 |
| 8,946,806 | B2* | 2/2015 | Tan | H01L 27/11521 257/316 |
| 9,064,803 | B2* | 6/2015 | Toh | H01L 29/42328 |
| 9,111,639 | B2* | 8/2015 | Hong | G11C 11/5621 |

(Continued)

OTHER PUBLICATIONS

Fang et al., "A Highly Reliable 2-Bits/Cell Split-Gate Flash Memory Cell With a New Program-Disturbs Immune Array Configuration", IEEE Transactions on Electron Devices, Jul. 2014, 7 pages, vol. 61, No. 7.

*Primary Examiner* — Viet Q Nguyen
(74) *Attorney, Agent, or Firm* — Viering Jentschura & Partner mBB

(57) ABSTRACT

A device having at least one memory cell over a substrate is provided. The at least one memory cell includes a source region and a drain region in the substrate, and a first gate and a second gate over the substrate. The first and second gates are arranged between the source region and the drain region. The first and second gate are separated by an intergate dielectric. The first gate is configured as a select gate and erase gate of the at least one memory cell, and the second gate is configured as a storage gate of the at least one memory cell. The second gate comprises a floating gate and a control gate over the floating gate. The device further includes source/drain (S/D) contacts extending from the source region and the drain region. The source region and the drain region are coupled to either one of a source line (SL) or a bit line (BL) through the S/D contacts.

17 Claims, 14 Drawing Sheets

(56) References Cited

U.S. PATENT DOCUMENTS

| | | | |
|---|---|---|---|
| 9,190,532 B2* | 11/2015 | Wang | H01L 29/42328 |
| 9,245,638 B2* | 1/2016 | Do | G11C 16/0433 |
| 9,276,206 B2* | 3/2016 | Tan | H01L 45/1226 |
| 9,362,374 B2* | 6/2016 | Tan | H01L 29/42324 |
| 9,818,867 B2* | 11/2017 | Tan | H01L 29/42324 |
| 9,917,165 B2* | 3/2018 | Wu | H01L 29/42328 |
| 9,947,678 B2* | 4/2018 | Hsieh | H01L 27/11519 |
| 10,090,311 B1* | 10/2018 | Guo | H01L 27/11521 |
| 10,103,156 B2* | 10/2018 | Cai | G11C 16/0491 |
| 10,276,582 B2* | 4/2019 | Sun | H01L 27/11519 |
| 10,468,427 B2* | 11/2019 | Cai | H01L 28/60 |
| 2005/0258474 A1* | 11/2005 | Tanaka | H01L 29/40114 |
| | | | 257/316 |
| 2006/0024887 A1* | 2/2006 | Wong | G11C 16/0433 |
| | | | 438/257 |
| 2006/0170028 A1* | 8/2006 | Jeon | G11C 16/0425 |
| | | | 257/314 |
| 2008/0049517 A1* | 2/2008 | Hung | G11C 16/0433 |
| | | | 365/185.28 |
| 2009/0003074 A1* | 1/2009 | Georgescu | G11C 16/0433 |
| | | | 365/185.18 |
| 2009/0059678 A1* | 3/2009 | Strenz | H01L 29/66825 |
| | | | 365/185.29 |
| 2010/0290292 A1* | 11/2010 | Tanizaki | G11C 16/10 |
| | | | 365/185.22 |
| 2015/0194217 A1 | 7/2015 | Gu et al. | |
| 2015/0236031 A1* | 8/2015 | Mantelli | H01L 27/11524 |
| | | | 365/185.28 |
| 2015/0263123 A1* | 9/2015 | Cheng | H01L 29/66825 |
| | | | 257/319 |
| 2016/0148944 A1* | 5/2016 | Yu | H01L 27/11536 |
| | | | 438/258 |
| 2017/0125429 A1* | 5/2017 | Su | H01L 27/11524 |
| 2017/0194056 A1* | 7/2017 | Heinrich-Barna | |
| | | | G11C 16/0425 |

\* cited by examiner

MEMORY ARRAYS AND METHODS OF FORMING THE SAME

TECHNICAL FIELD

The present disclosure relates generally to semiconductor devices, and more particularly to non-volatile memory devices and methods of forming the same.

BACKGROUND

Non-volatile memory (NVM) devices are able to retain stored data, even when the power supply is interrupted. Non-volatile memory devices include flash devices, which can be programmed using electrical signals. NVM memory cells may be interconnected to form a memory array. For example, the various terminals of a memory cell are coupled to metal lines in interconnect levels.

A NVM cell, for example, may include a select gate, and a stacked control gate over a floating gate between source and drain regions. The memory cell may further include an erase gate over the source region of the memory cell. The erase gate may be shared with an adjacent memory cell. Programming operations of such memory cells may be performed by source side injection (SSI) of electrons to the floating gate, while erase operations may be performed by Fowler-Nordheim (FN) tunneling of electrons from the floating gate to the erase gate. The programming operations using SSI for such cells requires a high current to be applied to cause electrons to be accelerated between the source and drain regions and injected into the floating gate. This causes the floating-gate based memory device to have high energy consumption during programming operations.

From the foregoing discussion, it is desirable to provide power efficient memory devices which may be used in memory applications, particularly low power memory applications.

SUMMARY

Embodiments generally relate to semiconductor device and method for forming a semiconductor device. In some embodiments, a device and method for forming the device is provided. In one embodiment, the device includes a substrate defined with a memory cell region and at least one memory cell over the substrate. The at least one memory cell includes a source region and a drain region in the substrate, and a first gate and a second gate over the substrate. The first and second gates are arranged between the source region and the drain region. The first gate and the second gate are separated by an intergate dielectric. The first gate is configured as a select gate and erase gate of the at least one memory cell, and the second gate is configured as a storage gate of the at least one memory cell. The second gate comprises a floating gate and a control gate over the floating gate. The device further includes source/drain (S/D) contacts extending from the source region and the drain region. The source region and the drain region are coupled to either one of a source line (SL) or a bit line (BL) through the S/D contacts.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

Figure 1:
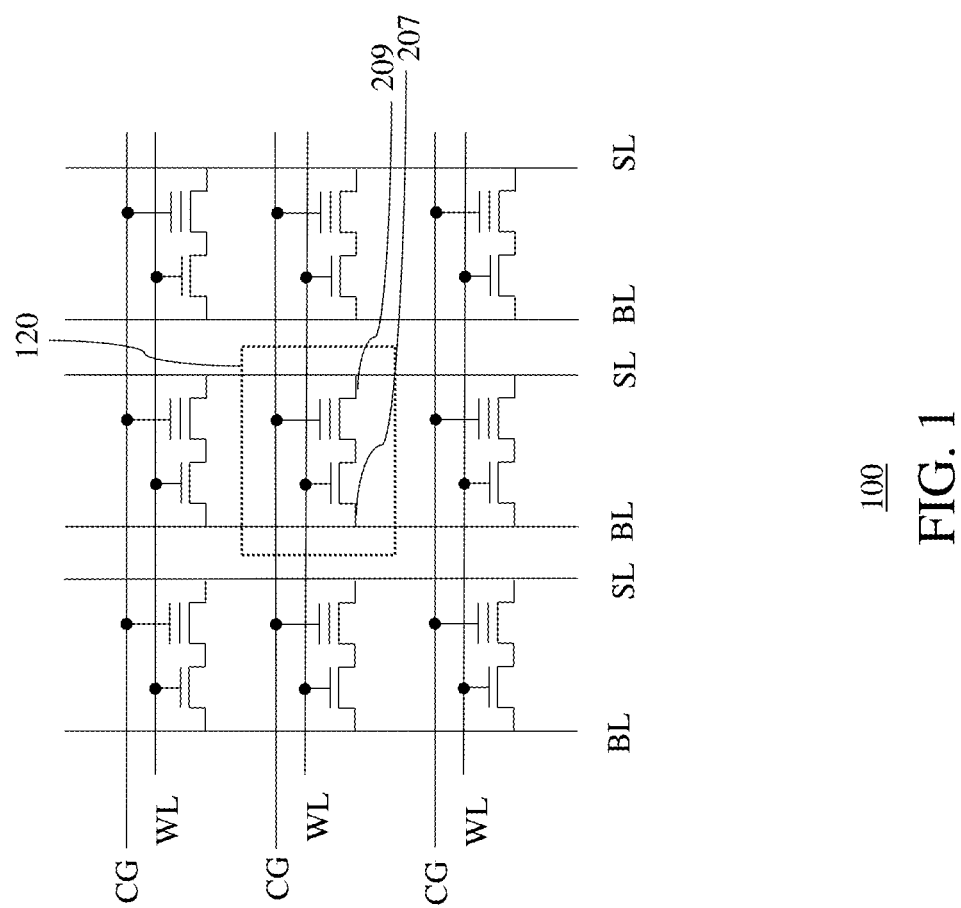
FIG. 1 shows a schematic diagram of an embodiment of a memory array.

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises,"

"has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments of the present disclosure generally relate to semiconductor devices. More particularly, some embodiments relate to memory devices, such as non-volatile memory (NVM) devices. Embodiments may relate to a memory array having memory cells which enable low power programming operations and efficient erase operations. Such memory devices, for example, may be incorporated into standalone memory devices including, but not limited to, Universal Serial Bus (USB) or other types of portable storage units, or integrated circuits (ICs), such as microcontrollers or system on chips (SoCs). The devices or ICs may be incorporated into or used with, for example, consumer electronic products, or related to other types of devices and applications including neuromorphic computing in automotive applications.

FIG. 1 shows a schematic diagram of an embodiment of a memory array 100. The schematic diagram, for example, shows a portion of the memory array. The array includes a plurality of interconnected memory cells 120. The plurality of memory cells may be arranged in first and second directions. The first direction, for example, may include rows of the array while the second direction may include columns of the array. In other embodiments, the first direction may include columns of the array while the second direction may include rows of the array. It is understood that numerous memory cells may be arranged in columns and rows to form the memory array. Further, the array may be configured to have sub-arrays or sectors. Other configurations of the memory cells in the memory array may also be useful.

In a non-limiting embodiment, the memory cells of the array may be interconnected in the first direction by word lines (WLs) and control gate lines (CGs) to form rows of memory cells and in the second direction by bit lines (BLs) and source lines (SLs) to form columns of the memory cells. As shown, memory cells in a row may be coupled to a WL and CG, while memory cells in a column may be coupled to a BL and a SL. Each column of memory cells is interconnected by its respective BL and SL and each row of memory cells is interconnected by its respective WL and CG. Other configurations for interconnecting the memory cells to form an array may also be useful. The BL and SL are in parallel for each column of memory cells. As illustrated, memory cells in a column may be coupled to a common SL and a common BL. Memory cells in a row may be coupled to a common WL and CG. Memory operations such as read, write, and erase operations may be performed by applying voltages to the memory cells via the BLs, CGs, WLs and SLs.

In one embodiment, a memory cell 120 may be a split gate transistor. The memory cell 120 may include a first gate coupled to a second gate. The first gate and the second gate may be arranged between first and second S/D terminals 207 and 209. In one embodiment, the first gate serves as a select gate and erase gate of the memory cell, while the second gate serves as a storage gate of the memory cell. The second gate may include a floating gate and a control gate. A WL may be coupled to the first gate and a CG may be coupled to the control gate. The first and second S/D terminals, for example, may be formed by heavily doped regions. In a non-limiting embodiment, the first S/D terminal 207 may be coupled to the BL while the second S/D terminal 209 may be coupled to the SL. For example, the first S/D terminal may be the source terminal while the second S/D terminal may be the drain terminal. Alternatively, the first S/D terminal may be coupled to the SL while the second S/D terminal may be coupled to the BL of the memory cell. In this case, the first S/D terminal may be the drain terminal while the second S/D terminal may be the source terminal. Additionally, a body of the memory cell may include a doped well.

Figure 2A:
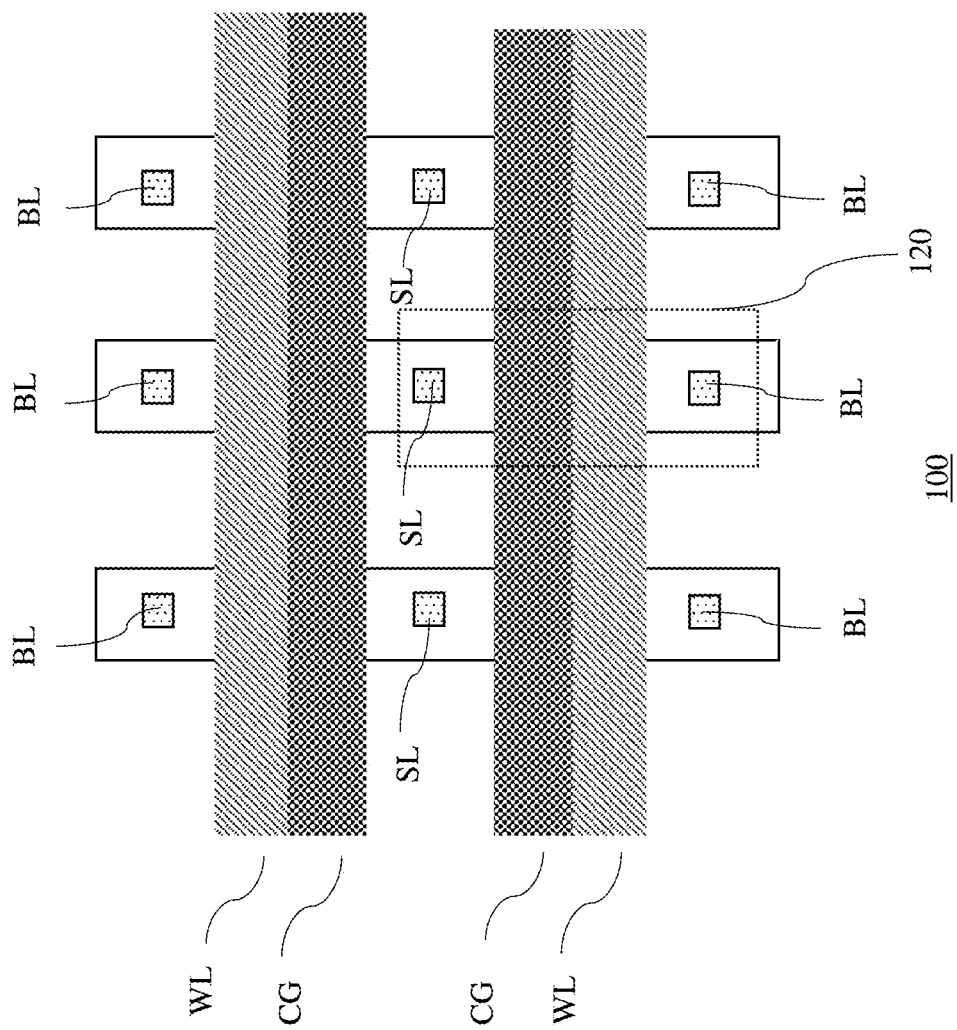
FIG. 2A shows a simplified top view of an embodiment of a device.
Figure 2B:
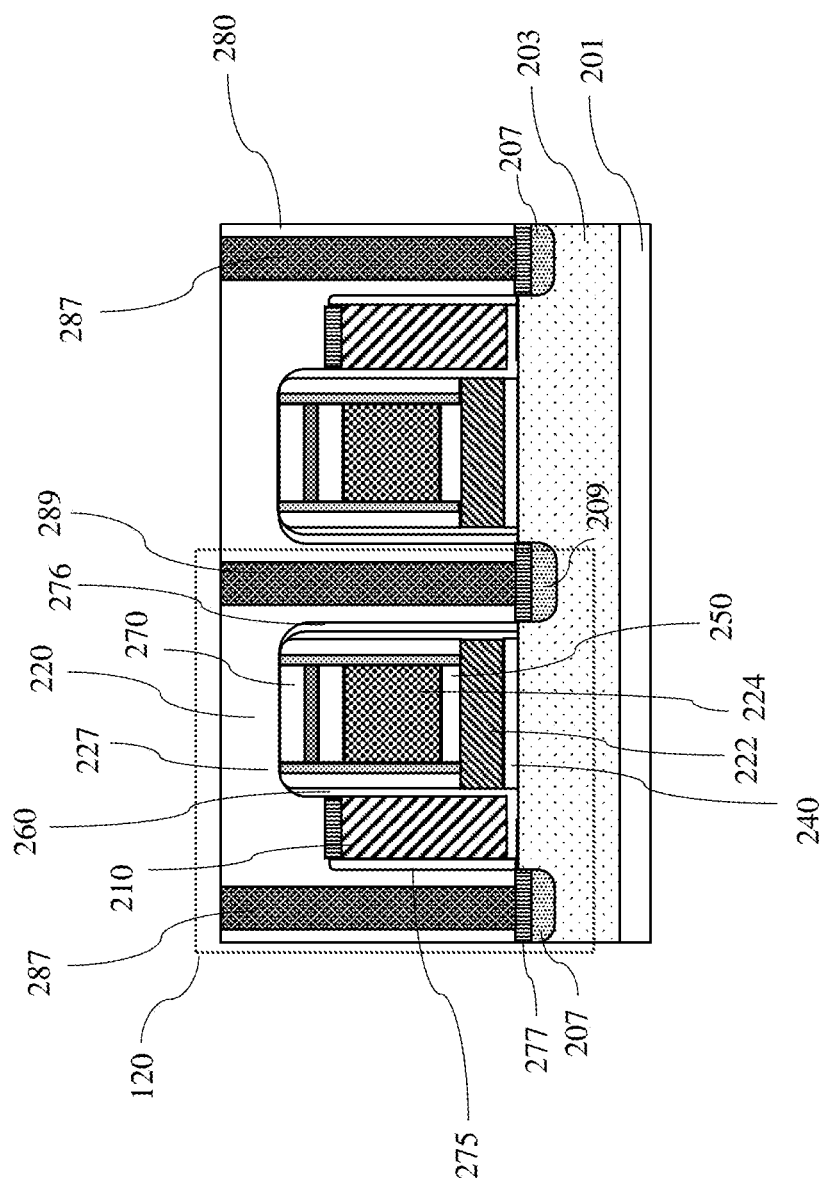
FIGS. 2B-2C show simplified cross-sectional views of an embodiment of the device.
Figure 2C:
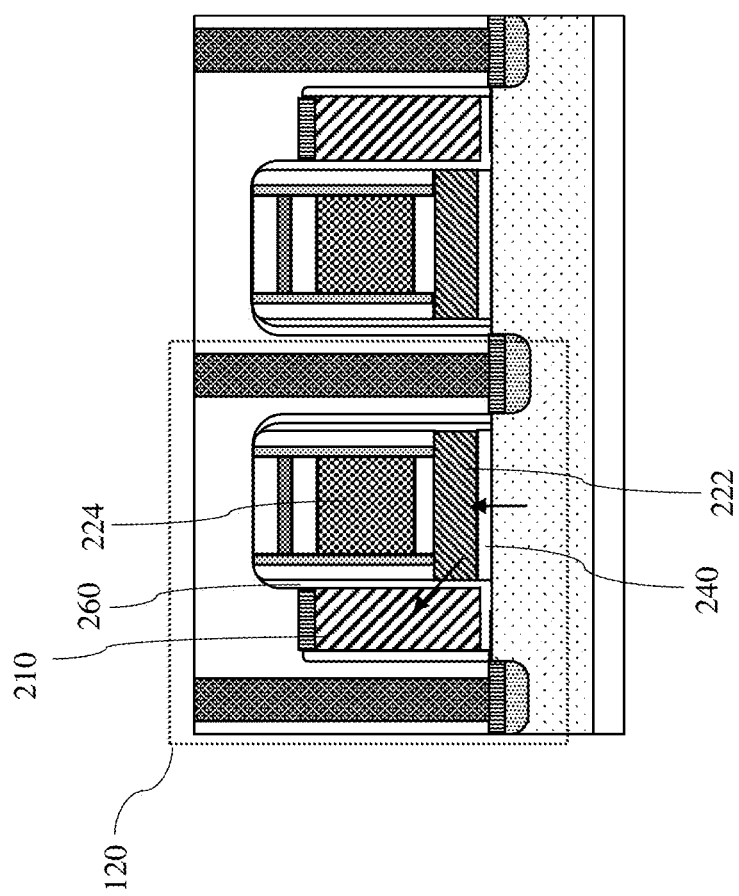

FIG. 2A shows a simplified top view of an embodiment of a device 100, while FIGS. 2B-2C show simplified cross-sectional views of an embodiment of the device 100. Referring to FIG. 2A, the device includes a plurality of memory cells 120 of a memory array. The top view shows a portion of the memory array. The memory array includes a plurality of memory cells arranged in a memory cell region of a substrate. The plurality of memory cells may be arranged in first and second directions. The first direction, for example, may include rows of the array while the second direction may include columns of the array. Other configurations of the memory cells in the memory array may also be useful. It is understood that numerous memory cells may be arranged in columns and rows to form the memory array. Further, the array may be configured to have sub-arrays or sectors.

Memory cells in a row may be coupled to a WL and a CG, while memory cells in a column may be coupled to a BL and a SL. The memory cells may be coupled to the BLs and SLs by first and second S/D contacts in a pre-metal dielectric (PMD) layer as will be described with respect to FIG. 2B.

FIG. 2B shows a portion of the memory array along the bit line/source line direction. The device may include at least one memory cell over a substrate 201. Illustratively, two memory cells are arranged over the substrate 201. For example, the memory cells are adjacent memory cells in the same column of the memory array. The two memory cells may be referred to as a pair of memory cells. It is understood that numerous memory cells may be arranged over the substrate, not just the pair of memory cells illustrated here.

The substrate 201 may be a semiconductor substrate, such as a silicon substrate in a non-limiting embodiment. Other types of semiconductor substrates may also be used. For example, the substrate may be silicon germanium, or siliconon-insulator (SOI), as well as intrinsic or doped with dopants. The substrate, for example, may be prepared with a memory cell region containing memory cells of the device. Providing a substrate prepared with other types of regions (not shown) may also be useful. For example, the substrate may include a logic region for support or other types of logic circuitry. The substrate may also include regions for other types of circuitry, depending on the type of device or IC. For example, the logic region may include sub-regions for high voltage (HV), medium voltage (MV), and low voltage (LV) devices.

In some embodiments, the device may be a first polarity type device (e.g., an n-type device), and the memory cell region may include a body or doped well 203 with dopants of a second polarity type. The doped well may be lightly or intermediately doped. In a non-limiting example, the doped well may have a dopant concentration ranging from about $1\times10^{16}$ cm$^{-3}$ to about $1\times10^{17}$ cm$^{-3}$. Providing a doped well having other dopant concentrations may also be useful. The doped well may serve as the body of the transistors of the memory cells in the memory region. The doped well may be a common doped well in the memory region for the memory cells. The second polarity type doped well serves as a well for the first polarity type device. In one embodiment, the second polarity type may be p-type. For example, the p-type doped well serves as a well for an n-type memory cells. Conversely, providing an n-type doped well may also be useful. For example, an n-type doped well serves as a well for p-type memory cells. P-type dopants can include boron (B), aluminum (Al), indium (In) or a combination thereof while n-type dopants can include phosphorus (P), arsenic (As), antimony (Sb) or a combination thereof.

In some embodiments, the substrate may include isolation regions (not shown) to isolate active device regions from other active device regions. The isolation regions, for example, may be shallow trench isolation (STI) regions in a non-limiting example. Other types of isolation regions are also useful. For example, isolation regions may be used to isolate columns of memory cells. Other configurations of isolation regions may also be useful.

In one embodiment, a memory cell 120 includes first and second cell terminals or source/drain (S/D) regions 207 and 209 in the substrate. In a non-limiting example, the first S/D region 207 may be a drain region of the memory cell, while the second S/D region 209 may be a source region of the memory cell. Other configurations may also be useful. For example, the first S/D region 207 may be a source region of the memory cell, while the second S/D region 209 may be the drain region of the memory cell.

In one embodiment, the first and second S/D regions may be doped with dopants of a first polarity type. For example, the first polarity type may be n-type dopants. Other configuration for the dopants may also be useful. For example, the first polarity type may be p-type dopants. Alternatively, the first and second S/D regions may be doped with dopants of a second polarity type. The first and second S/D regions, for example, may be heavily doped regions. The dopant concentration of the first and second S/D regions, for example, may range from $1\times10^{19}$ cm$^{-3}$ independently to $1\times10^{20}$ cm$^{-3}$. Other dopant concentrations may also be useful. The first and second S/D regions may have the same or different dopant concentrations.

In one embodiment, the second S/D region 209 may be common, i.e. shared, between adjacent memory cells. For example, in the case where the second S/D region 209 is a source region, the memory cells of a memory cell pair may share the same source region 209. In one embodiment, the first S/D region 207 be common doped regions with adjacent memory cells in the same column. For example, adjacent memory cells in a column share the same drain regions. Other configurations of the memory cells may also be useful.

A memory cell 120 includes a first gate 210 and a second gate 220 over the substrate. The first gate 210 and the second gate 220 may be arranged between the first and second S/D regions 207 and 209 (i.e, between the source region and the drain region). The first and second gates may form a split gate of the memory cell 120. The first gate 210 may be configured as a select gate and erase gate of the memory cell. The second gate 220 may be configured as a storage gate of the memory cell. The second gate 220 includes a floating gate 222 and a control gate 224. The first gates 210, floating gates 222 and control gates 224 of the memory cells may be polysilicon gates in a non-limiting example. The polysilicon gates may be doped. Other types of gates and material, such as metal, for the first gates 210, floating gates 222 and control gates 224 may also be useful. Further, the gates may be formed of the same or different material. The first gate 210 may form a common gate for a row of memory cells. Similarly, the floating gate 222 and control gate 224 may form common gates for a row of memory cells.

As shown, the first gate 210 may be arranged between the first S/D region 207 and the second gate 220. In the case the first S/D region 207 is a drain region, the first gate 210 may be arranged between the drain region and the second gate 220. Other configurations may also be useful. In some embodiments, a portion of the first gate 210 may overlap over a top surface of the floating gate 222 (not illustrated).

The second gate 220 may be separated from the substrate 201 by a tunneling dielectric 240. In one embodiment, the tunneling dielectric 240 extends at least between the floating gate 222 and the substrate 201. The tunneling dielectric 240 may be arranged on or over the substrate 201. The floating gate 222 may be arranged on or over the tunneling dielectric 240. The tunneling dielectric 240 may serve as a gate dielectric, storage dielectric, insulating dielectric, or a combination thereof.

In some embodiments, the tunneling dielectric 240 may be a single dielectric layer. In a non-limiting example, the tunneling dielectric 240 may be, or include, an oxide layer, such as a silicon oxide layer formed by chemical vapor deposition (CVD). In other embodiments, the tunneling dielectric 240 may be a thermal silicon oxide layer formed from thermal oxidation. The tunneling dielectric 240, for example, may have a thickness of about 100 A. In other embodiments, the tunneling dielectric 240 may be a stack of dielectric layers. In other words, the tunneling dielectric 240 may include a plurality of sub-layers. Other types of dielectric layers or thicknesses may also be useful.

The control gate 224 may be separated from the floating gate 222 by a control gate dielectric 250. A control gate dielectric, for example, may be a single dielectric layer or a stack of dielectric layers. For example, the control gate dielectric may be a stack of dielectric layers such as oxide and nitride layers. For example, the control gate dielectric may be an oxide/nitride/oxide (ONO) stack, such as a silicon oxide/silicon nitride/silicon oxide, in a non-limiting example. The thickness of the control gate dielectric having an ONO stack, for example, may be about 50 A/50 A/50 A. Other types of dielectric layers, such as aluminum oxide, may also be useful for isolating the control gate from the floating gate. Other combinations of dielectric layers and thicknesses for the control gate dielectric 250 may also be useful.

In some embodiments, a hard mask layer 270 may be arranged over the control gate 224. The hard mask layer, for example, may be a dielectric layer, such as an aluminum oxide layer, a silicon oxide layer, a polysilicon layer, a silicon nitride layer, and combinations thereof. In other embodiments, the hard mask layer may be a stack of dielectric layers such as oxide and silicon nitride layers. Other suitable types of hard mask or dielectric materials may also be useful as would be recognized by those skilled in the art.

Control gate spacers 227 may be formed on sidewalls of the control gates 224. The spacers may be dielectric spacers. In a non-limiting example, the control gate spacers are spacer stacks having multiple layers. For example, the control gate spacers 227 includes first control gate spacer dielectric layer on the sidewalls of the control gate, and a second control gate spacer dielectric layer over the first control gate spacer dielectric layer. The first control gate spacer dielectric layer may be an oxide layer, such as a silicon oxide layer while the second control gate spacer dielectric layer may be a nitride layer, such as a silicon nitride layer, in a non-limiting example. Alternatively, the first control gate spacer dielectric layer may be a nitride layer, such as a silicon nitride layer while the second control gate spacer dielectric layer may be an oxide layer. Other types of dielectric materials for the control gate spacers 227 may also be useful. For example, the control gate spacers 227 may have a single dielectric layer.

The first gate 210 and the second gate 220 may be separated by an intergate dielectric 260. The intergate dielectric 260 is arranged between the first gate 210 and the second gate 220. Additionally, the intergate dielectric 260 may be arranged between the first gate 210 and the substrate 201. As illustrated, intergate dielectric 260 is disposed between the first gate 210 and the floating gate 222 and the control gate 224, as well as between the first gate 210 and the substrate 201. In the case where the memory cell include control gate spacers 227 on sidewalls of the control gate 224, the intergate dielectric 260 may be arranged between the first gate 210 and the control gate spacer 227 of the control gate 224. The intergate dielectric 260, for example, may be or include an oxide layer, such as silicon oxide layer in a non-limiting example. The intergate dielectric 260, for example, may have a thickness ranging from about 120 A to about 150 A. In another non-limiting example, the intergate dielectric 260 may be a stack of dielectric layers, such as a combination of oxide and nitride layers. The intergate dielectric 260 may serve as a gate dielectric, storage dielectric, insulating dielectric, or a combination thereof.

In some embodiments, a memory cell 120 may include a first gate spacer 275 arranged on a sidewall of the first gate 210 adjacent to the first S/D region 207, and a second gate spacer 276 arranged on a sidewall of the second gate 220 adjacent to the second S/D region 209. The first gate spacer 275 and the second gate spacer 276, for example, may be formed of a dielectric material, such as a nitride layer in a non-limiting example. The first gate spacer 275 and the second gate spacer 276 may be, or include, silicon nitride layer in a non-limiting example. Other types of spacers may also be useful.

In some embodiments, silicide contacts 277 may be disposed over the first and second S/D regions 207 and 209 and the first gates 210 of the memory cells. In a non-limiting example, the silicide contacts 277 may be nickel-based silicide contacts, such as nickel-alloy.

As illustrated in FIG. 2B, adjacent memory cells in a column may form a pair of memory cells. The pair of memory cells may share a common second S/D region 209. In the case the first S/D region 207 is a drain region and the second S/D region is a source region, the pair of memory cells may share a common source region 209. Further, each of the memory cell may share a common drain region 207 with an adjacent memory cell in the same column.

In one embodiment, a dielectric layer 280 may be disposed over the substrate, covering the first and second gates 210 and 220 of the memory cells. The dielectric layer 280, for example, serves as a dielectric layer of an interlevel dielectric (ILD) layer. An ILD layer may include interconnects in a plurality of layers. For example, the ILD layer includes a plurality of ILD or interconnect levels. An ILD level includes a metal dielectric level over a contact dielectric level. The metal dielectric level includes conductive or metal lines while the contact dielectric level includes contacts. The metal lines and contacts may be formed of a conductive material, such as copper, copper alloy, aluminum, tungsten, alloys thereof, or a combination thereof. Other suitable types of metals, alloys or conductive materials may also be useful.

The first contact dielectric level may be referred to as the pre-metal dielectric (PMD) or CA level, while the metal dielectric level above the PMD may be referred to as metal level M1. The dielectric layer 280 may be the PMD or CA level of an ILD layer. The dielectric layer 280 may be formed by a dielectric material such as silicon oxide. Providing other types of dielectric materials such as silicon nitride may also be useful.

In one embodiment, first and second S/D contacts 287 and 289 are disposed in the dielectric layer 280. As shown in FIG. 2B, the first S/D contacts 287 may be coupled to the first S/D region 207, while the second S/D contacts 289 may be coupled to the second S/D region 209. The first and second S/D contacts 287 and 289 may be via contacts of the PMD level of the ILD layer.

The device may further include a first metal level M1 over the PMD level, as well as additional or further interconnect levels (e.g., via level V1, metal level M2, via level V2, metal level M3) of the ILD layer (not shown). For example, a second dielectric layer of the ILD layer may be arranged over the substrate, covering the dielectric layer 280. The second dielectric layer, for example, serves as a metal level such as the first metal level M1 of the ILD layer. The dielectric layer, for example, is a silicon oxide layer. Other types of dielectric layers may also be useful. Conductive or metal lines may be formed in the metal level. Additional via levels and metal levels of the ILD layer may be arranged over the substrate. The number of via levels and metal levels may depend on design requirements.

Source lines (SLs) and bit lines (BLs) may be disposed in the metal levels of the ILD layer. In a non-limiting example, the BLs and SLs may be disposed in metal level M2 of the ILD layer. For example, the BLs and SLs are disposed in the same metal level. In the case the BLs and SLs are formed in metal level M2, the BLs and SLs are coupled to the first S/D contacts 287 and the second S/D contacts 289 in the PMD (or CA) level through metal level V1 and via level V1. Arranging the BLs and SLs in other metal levels may also be useful. In other examples, the SLs and BLs may be disposed in different metal levels of the ILD layer. The BLs and SLs may be disposed in the second direction (e.g., column direction).

The BLs and SLs may be coupled to the first and second S/D regions of the memory cells via the first and second S/D contacts 287 and 289. For example, a first S/D region 207 may be coupled to a SL or a BL via a first S/D contact 287, while a second S/D region 209 may be coupled to a SL or a BL via a second S/D contact 289. In the case the first S/D region 207 is a drain region and the second S/D region 209 is a source region, the drain region 207 may be coupled to a BL via the first S/D contact 287, and the source region 209 may be coupled to a SL via the second S/D contact 289. A pair of memory cells in a column sharing a common source region may be coupled to a common SL.

selected cell. For example, a high positive voltage ranging from about 11V to about 13V is applied to the WL, while a voltage applied to the BL, SL and CG may be about 0V. In a non-limiting example, the WL may be biased at 12V, while the BL, SL and CG may be biased at 0V.

Table 1 shows exemplary biasing conditions applied to the memory cell of the memory array for read, write and erase operations as follows:

| | Signal (V) | | | | | | | | |
|---|---|---|---|---|---|---|---|---|---|
| | BL | | SL | | CG | | WL | | |
| Operation | Sel | Un-sel | Sel | Un-sel | Sel | Un-sel | Sel | Un-sel | Well |
| Read | 0.8 | 0 | 0 | 0 | $V_{read}$ | 0 | $V_{read}$ | 0 | 0 |
| Write | 0 | 0 | $V_{pp1}$ | 0 | $V_{pp2}$ | $V_{pp2}$ | 0 | 0 | $V_{pp1}$ |
| Erase | 0 | 0 | 0 | 0 | 0 | 0 | 12 | 0 | 0 |

As described in FIG. 1 and FIGS. 2A-2B, a WL may be coupled to the first gate 210, a CG may be coupled to the control gate 224, a SL may be coupled to the source region, and a BL may be coupled to a drain region of a memory cell 120. Bias voltages applied to the SL, BL, control gate 224, and first gate 210 triggers electron tunneling from a channel in the substrate beneath the floating gate 222 through the tunneling dielectric 240 to the floating gate 222 during programming operations, and electron tunneling from the floating gate 222 through the intergate dielectric 260 to the first gate 210 during erase operations, as illustrated by the arrows in FIG. 2C. The electron tunneling during the programming and erase operations may be Fowler-Nordheim (FN) tunneling in a non-limiting example. Providing electron tunneling from a channel in the substrate beneath the floating gate 222 through the tunneling dielectric 240 to the floating gate 222 enables smaller current compared to using source side injection (SSI) during the programming operations, which reduces the amount of power required during programming operations. Additionally, performing programming and erase operations through the different tunneling paths reduces degradation of the tunneling dielectric 240 and improves durability of the memory cell. Further, providing the memory array with the memory cells having electron tunneling during programming and erase operations is advantageous for low power applications (e.g., in neuromorphic computing).

During a programming operation, a positive voltage is applied to the CG, and a negative voltage is applied to the SL and the doped well, while a low voltage may be applied to the BL and WL of the selected cell, to trigger electron tunneling from a channel in the substrate beneath the floating gate 222 through the tunneling dielectric 240 to the floating gate 222. For example, a high positive voltage ranging from about 8V to about 12V is applied to the CG, and a high negative voltage ranging from about −5V to about −3V is applied to the SL and the doped well, while a low voltage of about 0V is applied to the BL and WL of the selected cell. In a non-limiting example, the CG may be biased at about 10V, the SL and doped well may be biased at about −5V, while the BL and WL may be biased at about 0V. The doped well and SL may be biased at the same voltage for the selected cell.

During an erase operation, a positive voltage is applied to the WL while a low voltage is applied to the BL, SL and CG to trigger electron tunneling from the floating gate 222 through the intergate dielectric 260 to the first gate 210 of the Exemplary values for $V_{pp1}$ may be about −5V, $V_{pp2}$ may be about 10V, while $V_{read}$ may be about 2.5V. Other suitable biasing conditions may also be useful. Such values for the $V_{pp1}$ and $V_{pp2}$ for electron tunneling enables programming time of 100 mS and programming current of 3fA, which is significantly lower than the programming current for biasing conditions employed in SSI.

FIGS. 3A-3J show simplified cross-sectional views of an embodiment of a process 300 for forming a device. The cross-sectional views, for example, are along the second direction or bit line/source line direction of the device. The cross-sectional views illustrate a portion of the memory array region of the device. The device, for example, may be similar to that described in FIGS. 1 and 2A-2C. Common elements may not be described or described in detail. As discussed, the device may include other device regions (not shown), such as logic regions, including HV, MV and LV regions. The various regions may include device wells for respective devices.

Figure 3A:
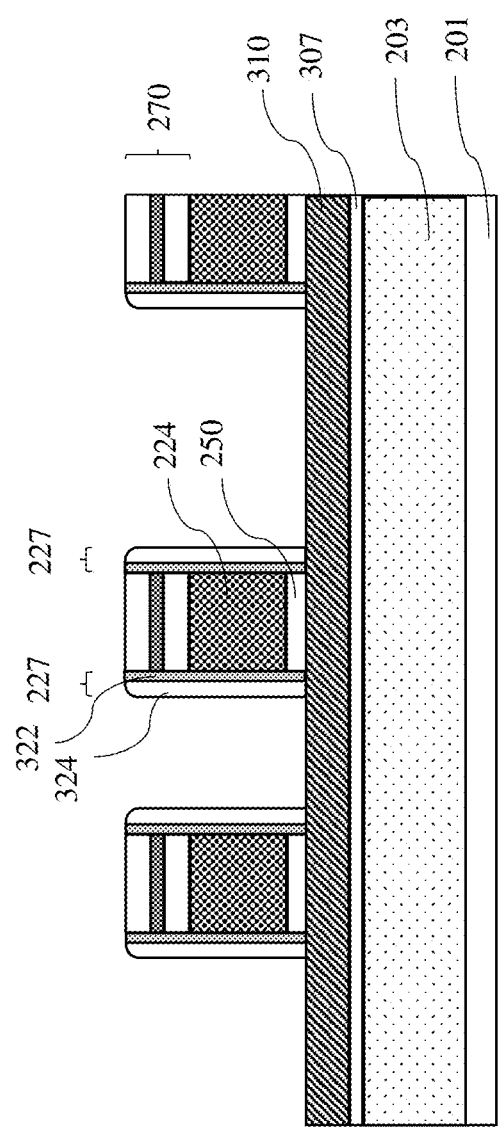
FIGS. 3A-3J show simplified cross-sectional views of an embodiment of a process for forming a device.

Referring to FIG. 3A, a substrate 201 is provided. The substrate, for example, may be a silicon substrate. Other types of semiconductor substrates may also be used. For example, the substrate may be silicon germanium or silicon-on-insulator (SOI) as well as intrinsic or doped with other dopants. The substrate may be processed to form wells such as a body or doped well 203 in the array region. In a non-limiting embodiment, second polarity type dopants may be implanted into the substrate to form the doped well 203. The second polarity type dopants, for example, include p-type dopants. Alternatively, the second polarity type dopants may be n-type dopants. An implant mask may be employed to implant the dopants to form the doped well. The implant mask, for example, is a patterned photoresist layer. The implant mask exposes regions of the substrate in which doped wells are to be formed. The doped well may be lightly or intermediately doped with the second polarity type dopants. For example, the device well may have a dopant concentration ranging from about $1\times10^{16}$ cm$^{-3}$ to about $1\times10^{17}$ cm$^3$. Other dopant concentrations may also be useful. Different wells may be formed using different implant processes.

At least one memory cell may be arranged over the substrate 201. Arranging the at least one memory cell over the substrate includes arranging a first gate and a second gate over the substrate 201. In a non-limiting embodiment, arranging the at least one memory cell includes forming various gate layers over the substrate 201. In one embodiment, a tunneling dielectric layer 307, a floating gate electrode layer 310, a control gate dielectric layer (not shown), a control gate electrode layer (not shown), and a hard mask layer (not shown) are formed over the substrate 201. In a non-limiting embodiment, the tunneling dielectric layer 307 may be a single dielectric layer. In a non-limiting example, the tunneling dielectric layer 307 may be, or include, an oxide layer such as a silicon oxide layer formed by chemical vapor deposition (CVD). Alternatively, or additionally, the tunneling dielectric layer 307 may include a thermal silicon oxide layer formed by thermal oxidation. In other embodiments, the tunneling dielectric layer 307 may be a stack of dielectric layers. The control gate dielectric layer may be a single dielectric layer or a stack of dielectric layers. In one embodiment, the control gate dielectric layer may be an oxide/nitride/oxide (ONO) stack, such as a silicon oxide/silicon nitride/silicon oxide, in a non-limiting example. As for the hard mask layer, it may be a single dielectric layer, such as a silicon nitride layer in a non-limiting example. Alternatively, the hard mask layer may be a stack of dielectric layers, such as oxide and silicon nitride layers.

As for the floating gate electrode layer 310 and the control gate electrode layer, they may be polysilicon gate electrode layers formed by CVD in a non-limiting example. Other types of tunneling dielectric, control gate dielectric, and electrode layers and forming techniques may also be useful. For example, the electrode layers may be formed by metal.

The control gate dielectric layer, control gate electrode layer, and hard mask layer are patterned to form one or more control gates 224 over one or more control gate dielectrics 250, as shown in FIG. 3A. For example, the hard mask layer is patterned using a patterned soft mask, such as a patterned photoresist layer. The photoresist layer may be patterned by exposing it with an exposure source through a reticle. The pattern of the reticle is transferred to the photoresist layer after development. For example, the patterned photoresist mask protects portions of the substrate corresponding to the control gates 224. An etch is performed to pattern the hard mask layer. In a non-limiting example, the etch may be an anisotropic etch, such as a reactive ion etch (RIE). The patterned hard mask layer serves as an etch mask for patterning the control gate electrode layer and the control gate dielectric layer. After patterning the hard mask layer, the photoresist layer may be removed by ashing, in a non-limiting example. The patterned hard mask layer 270 may remain over the control gates 224. The control gates 224, for example, may be gate conductors along the first or control gate line direction. A gate conductor forms a common gate for a row of memory cells. Illustratively, three control gates of three memory cells are formed. It is understood that the array may include a plurality of memory cells which form columns and rows of memory cells.

Control gate spacers 227 may be formed on sidewalls of the control gates 224. The spacers may be dielectric spacers. In a non-limiting example, the control gate spacers are spacer stacks having multiple layers. For example, a first dielectric layer may be formed over the substrate by CVD. The first dielectric layer may be anisotropically etched, such as by RIE, to remove horizontal portions, leaving first control gate spacer dielectric layer 322 on the sidewalls of the control gates 224. A second dielectric layer is then formed over the first control gate spacer dielectric layer 322 by, for example, CVD. The second dielectric layer may be anisotropically etched, such as by RIE, to remove horizontal portions, leaving second control gate spacer dielectric layer 324 on the first spacer dielectric layer 322. The first control gate spacer dielectric layer 322 and the second control gate spacer dielectric layer 324 forms the control gate spacers 227 of the control gate 224. The first control gate spacer dielectric layer 322 may be an oxide layer such as a silicon oxide layer while the second control gate spacer dielectric layer 324 may be a nitride layer such as a silicon nitride layer, in a non-limiting example. Alternatively, the first control gate spacer dielectric layer 322 may be a silicon oxide layer, while the second control gate spacer dielectric layer 324 may be an oxide layer. Other types of dielectric materials as well as techniques for control gate spacers 227 may also be useful. For example, forming control gate spacers 227 having a single dielectric layer may also be useful.

In a non-limiting example, a gate threshold voltage (Vt) adjustment implant may be performed for the WL of the memory array. The implant may be performed using an implant mask, such as a resist mask (not shown). For example, the implant mask may have openings which correspond to a portion of the substrate over which one or more first gates will be formed subsequently. The area where the first gates will be formed later is exposed to receive the WL Vt adjustment implant. The one or more first gates may be coupled to WLs subsequently.

Figure 3B:
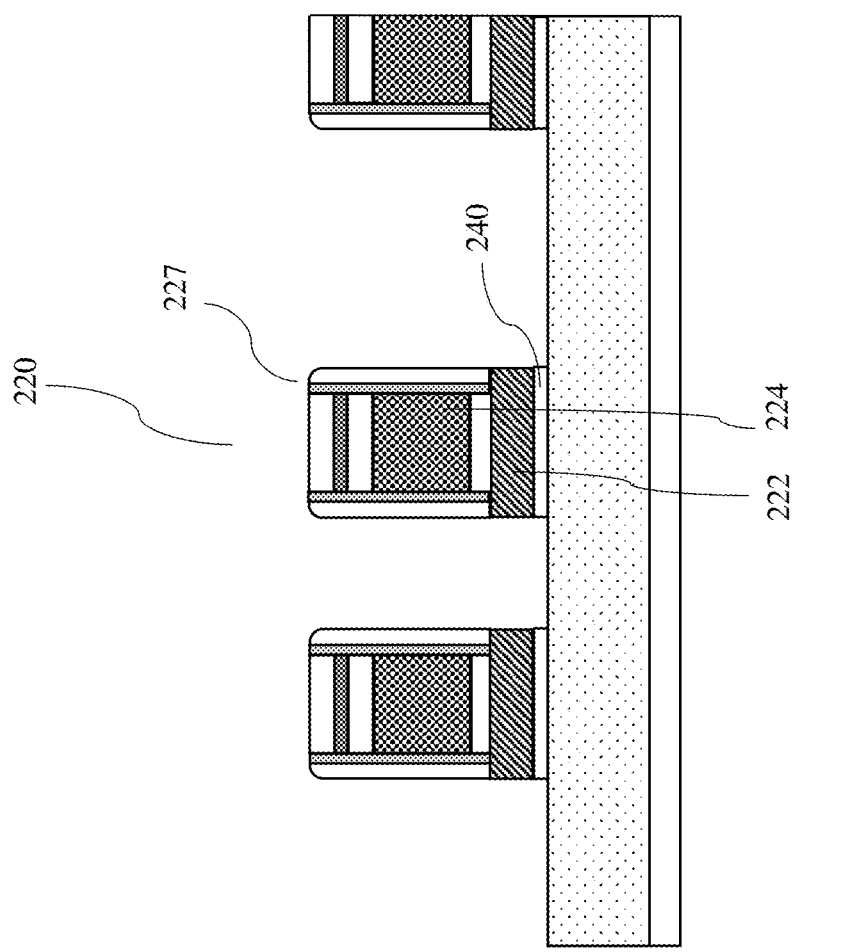

The process continues to pattern the floating gate electrode layer 310 to form one or more floating gates 222, as illustrated in FIG. 3B. The control gate spacers 227 may serve as an etch mask for patterning the floating gate electrode layer 310. In a non-limiting example, an anisotropic etch, such as RIE, may be used to remove exposed portions of the floating gate electrode layer 310. A floating gate 222 and a control gate 224 over the floating gate forms a second gate 220 of a memory cell. The second gate 220 may be configured as a storage gate of the memory cell. Exposed portions of the tunneling dielectric layer may be removed, forming the tunneling dielectric 240 under the floating gate 222. Remaining tunneling dielectric layer between the second gates 220 may be further removed following a cleaning step. The implant mask may then be removed by, for example, ashing. In some embodiments, a portion of the control gate spacer 227 may be removed (not shown). For example, a portion of the control gate spacer 227 on a side of the control gate 224 where first gates are to be formed later may be removed. In a non-limiting example, the oxide layer of the control gate spacer 227 is removed. Removing a portion of the control gate spacer 227 enables a floating gate to extend over the remaining control gate spacer of a control gate. This further enables overlap of a portion of the subsequently formed first gate over the floating gate in later steps. Overlap of the first gate over the floating gate improves performance of erase operations.

Figure 3C:
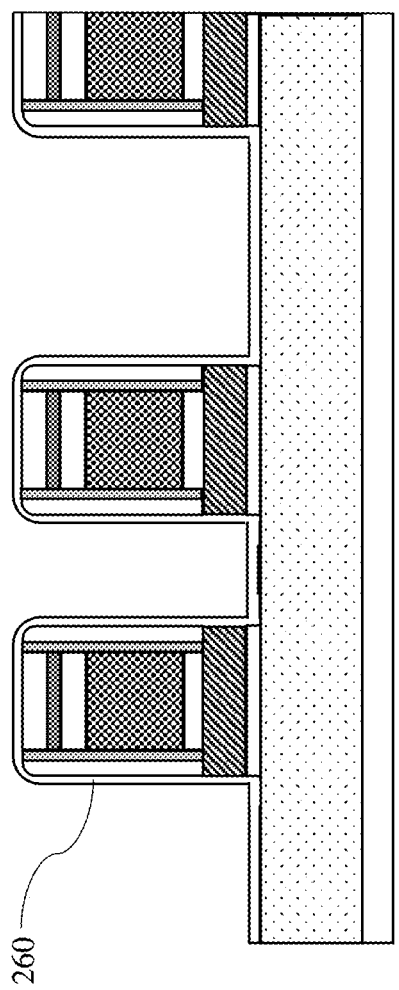

As illustrated in FIG. 3C, an intergate dielectric 260 may be formed over the substrate. The intergate dielectric 260, for example, may be or include an oxide layer, such as silicon oxide layer. In another example, the intergate dielectric 260 may be stack of dielectric layers such as a combination of oxide and nitride layers. The intergate dielectric 260 may be formed by, for example, CVD. The intergate dielectric 260 separates the second gates 220 from subsequently formed first gates.

Figure 3D:
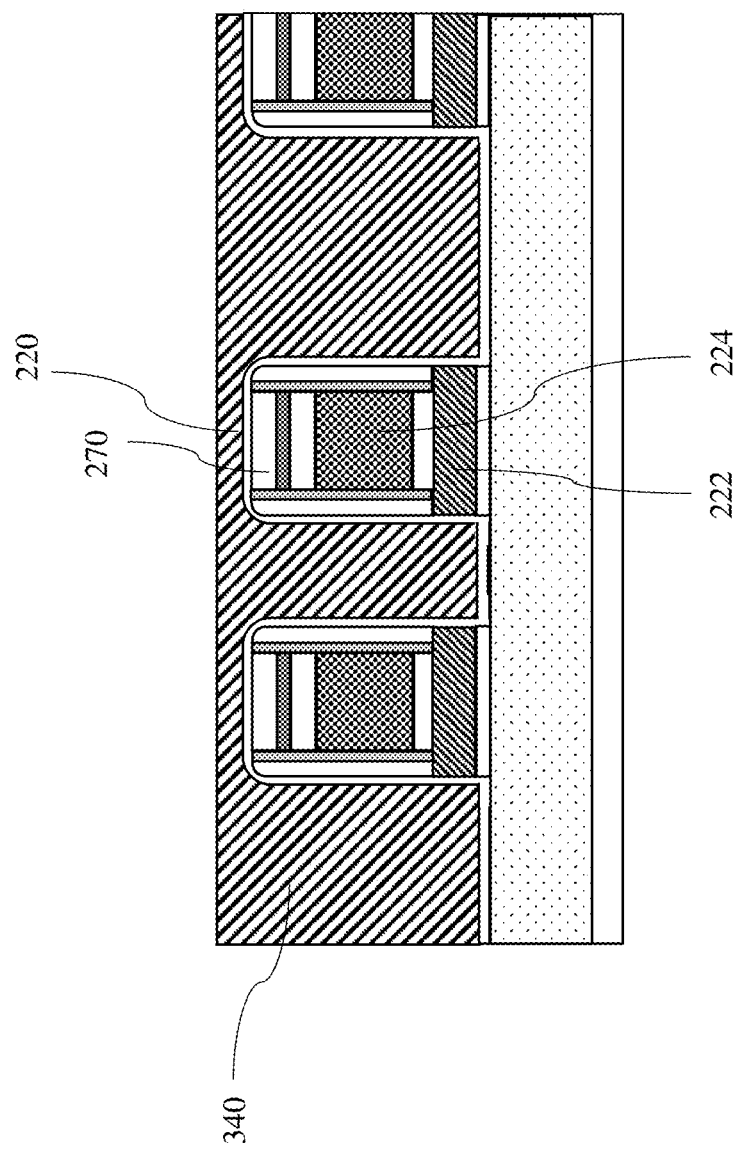

Referring to FIG. 3D, a first gate electrode layer 340 is formed over the substrate, filling the gaps between the second gates 220. The first gate electrode layer 340 may be a polysilicon layer in a non-limiting example. The first gate electrode layer 340 may be formed by CVD. Forming the first gate electrode layer 340 by other techniques may also be useful. The polysilicon may be doped with first polarity type dopants. The gate electrode layer 340 may be planarized to remove excess gate electrode layer. The planarization may form a substantially planar top surface between the second gates 220 and the first gate electrode layer 340. In the case, where the second gate 220 includes the hard mask layer 270 over the control gate 224, the planarization forms a substantially planar top surface between the second gates 220 and the hard mask layer 270. The planarization may be a chemical mechanical polishing (CMP) process in a non-limiting example. Other types of planarization techniques may also be useful. The planarization forms a planar top surface.

In one embodiment, the gate electrode layer 340 may be recessed to reduce a height of the gate electrode layer 340 to a desired height below a top surface of the second gate 220. An etch back may be performed to recess the gate electrode layer 340 to the desired height. In a non-limiting example, the gate electrode layer 340 may be recessed such that its top surface is below the top surface of the hard mask layer 270. In another example, the gate electrode layer 340 may be recessed such that its top surface is below a top surface of the control gates 224.

Figure 3E:
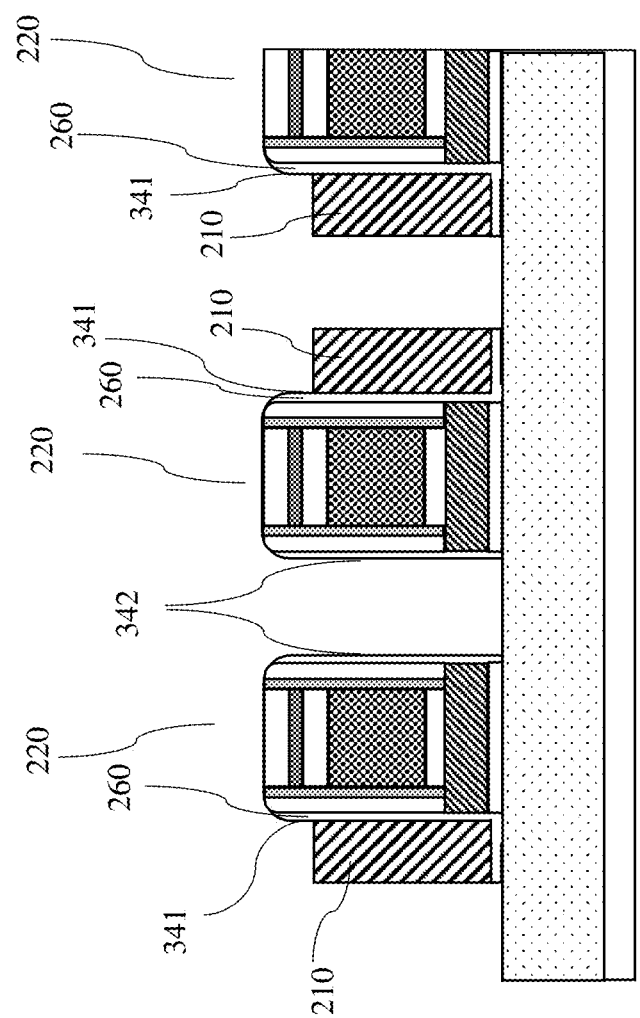

In one embodiment, the first gate electrode layer 340 may be patterned to form first gates 210 of the memory cells, as shown in FIG. 3E. A first gate 210 may be formed adjacent to a first side 341 of a second gate 220. The first gates 210 may be configured as a select gate and erase gate of each memory cell. The first gate 210 of a memory cell may be separated from the second gate 220 by the intergate dielectric 260. Patterning the first gate electrode layer 340 to form the first gates 210 includes removing portions of the first gate electrode layer from a second side 342 of the second gate 220. As shown in FIG. 3E, portions of the first gate electrode layer 340 is completely removed from regions between the second sides 342 of adjacent second gates 220 of adjacent memory cells. Portions of the first gate electrode layer 340 is completely removed from regions over the substrate where source regions of the memory cells are to be formed later. Patterning the first gate electrode layer 340 to form the first gates 210 and to remove portions of the gate electrode layer from a second side of the second gate 220 may be performed in a single step. Additionally, patterning the first gate electrode layer to form first gates 210 of the memory cells further removes exposed portions of the intergate dielectric 260, leaving portions of the intergate dielectric 260 remaining between the first gate 210 and the second gate 220 as well as between the first gate 210 and the substrate 201.

A mask and etch technique may be employed to pattern the first gate electrode layer 340. For example, a hard mask is disposed over the substrate. The hard mask may be patterned using a patterned soft mask, such as a patterned photoresist layer in a non-limiting example. The photoresist layer may be patterned by exposing it with an exposure source through a reticle. The pattern of the reticle may be transferred to the photoresist layer after development. For example, the patterned resist mask exposes regions between the first sides 341 of adjacent second gates 220, and regions between the second sides 342 of adjacent second gates 220 for patterning. The patterned resist mask protects regions between the first sides 341 of adjacent second gates 220 where first gates 210 are to be formed.

An etch may be performed to pattern the hard mask. The etch, for example, is an anisotropic etch, such as a RIE. After patterning the hard mask, the photoresist layer may be removed by, for example, ashing. The patterned hard mask serves as an etch mask for removing portions of the first gate electrode layer 340. The first gate electrode layer 340 may be etched by RIE to completely remove portions of the electrode layer between the second sides 342 of adjacent second gates 220 and to partially remove electrode layer between the first sides 341 of adjacent second gates 220, leaving first gates 210 over the first sides 341 of the second gates 220. The hard mask may be removed, for example, by ashing.

Figure 3F:
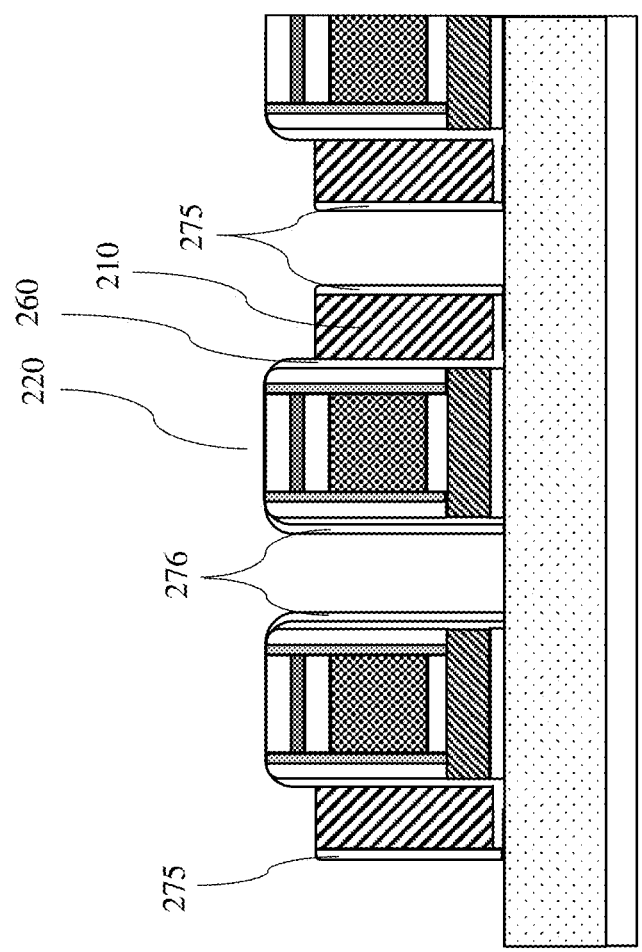

Referring to FIG. 3F, first gate spacers 275 and second gate spacers 276 may be formed on exposed sidewalls of the first gates 210 and the second gates 220 respectively. As shown, a first gate spacer 275 is formed on a sidewall of the first gate 210 opposite to the second gate 220, while a second gate spacer 276 is formed on a sidewall of the second gate 220 opposite to the first gate 210. The first gate spacers 275 and the second gate spacers 276 may be a formed of a dielectric material such as a nitride layer. The first gate spacers and the second gate spacers may be, or include, silicon nitride layer in a non-limiting example. Other types of spacers may also be useful.

Figure 3G:
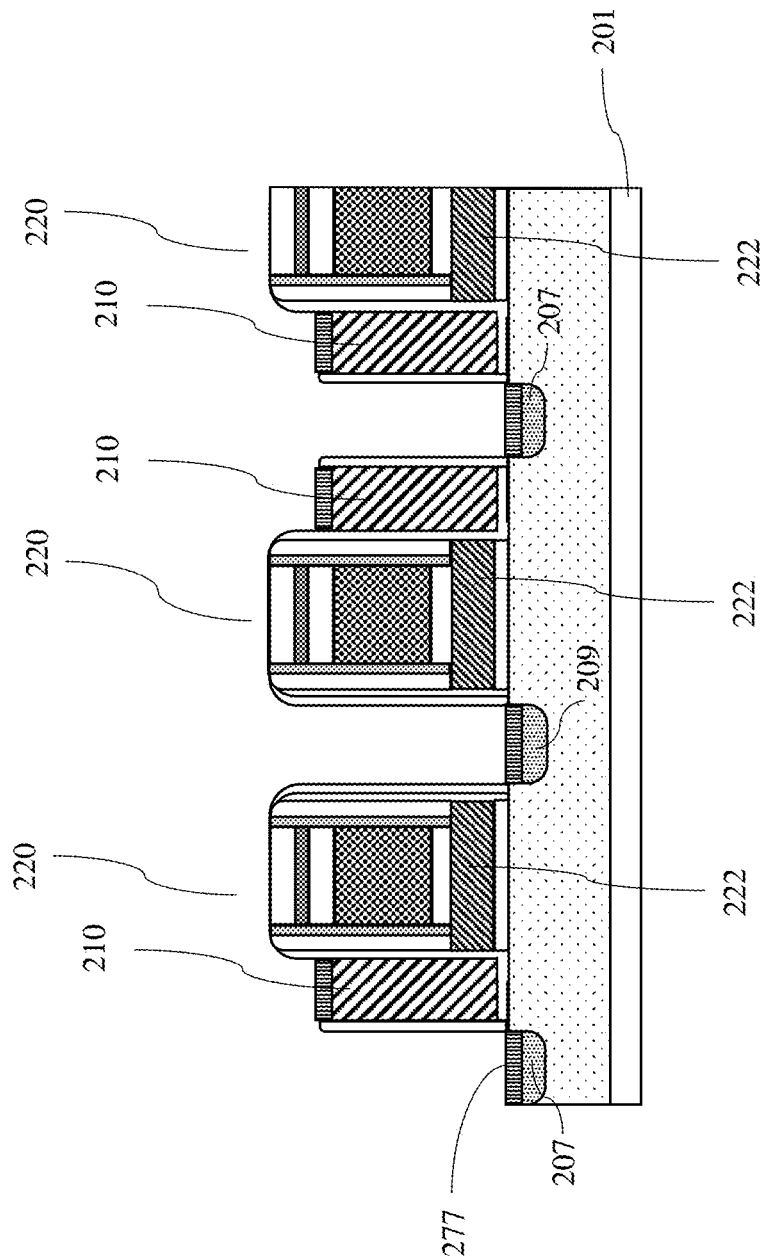

The process continues to form first and second S/D regions 207 and 209 of the memory cells, as shown in FIG. 3G. The first and second S/D regions 207 and 209 may be formed by implantation. An implant mask (not shown) may be formed over the substrate. For example, a vertical implant may be performed to implant first polarity type dopants. The implant forms first polarity type heavily doped first and second S/D regions 207 and 209 in the substrate. The first and second S/D regions 207 and 209 may be formed in the same implant step. The implant mask may be removed by ashing.

As illustrated in FIG. 3G, a first S/D region 207 may be formed between the first gates 210 of adjacent memory cells. In other words, adjacent memory cells in a column of the memory array may have a common first S/D region 207. As for the second S/D region 209, it may be formed between the second gates 220 of adjacent memory cells. For example, the second S/D region 209 is formed between the floating gates 222 of adjacent memory cells. In other words, adjacent memory cells in a column of the memory array may have a common second S/D region 209. For example, the first S/D region 207 may be a drain region, while the second S/D region 209 may be a source region. Alternatively, the first S/D region 207 may be a source region, while the second S/D region 209 may be a drain region.

As illustrated, the first gate 210 and the second gate 220 are arranged between the drain region and the source region. The first gate 210 may be arranged between the drain region 209 and the second gate 220. Adjacent memory cells sharing a common source region 207 may form a memory cell pair. For example, arranging the at least one memory cell over the substrate includes forming a source region, a drain region and a second drain region in the substrate, and arranging a first gate, a second gate, a third gate and a fourth gate over the substrate. The first gate and the second gate may be arranged between the source region and the drain region. The first gate is configured as a select gate and erase gate of the at least one memory cell, and the second gate is configured as a storage gate of the at least one memory cell. The second gate includes a floating gate and a control gate over the floating gate. The third gate and the fourth gate may be arranged between the source region and the second drain region. The third gate is configured as a second select gate and a second erase gate of the at least one memory cell, and the fourth gate is configured as a second storage gate of the at least one memory cell. The fourth gate includes a second floating gate and a second control gate over the second floating gate. The third gate may be arranged between the second drain region and the fourth gate.

As illustrated in FIG. 3G, silicide contacts 277 may be formed over the substrate. The silicide contacts may be formed on exposed portions of the substrate 201 and over the first gates 210. For example, silicide contacts may be formed on the first and second S/D regions 207 and 209 and the first gates 210 of the memory cells. In a non-limiting example, the silicide contacts 277 may be nickel-based silicide contacts, such as nickel-alloy. To form the silicide contacts 277, a metal layer may be deposited over the substrate. In a non-limiting example, a metal layer may be formed over the substrate by sputtering. An anneal is performed to cause a reaction with the exposed portions of the substrate and the first gates 210, forming silicide contacts 277 on the first and second S/D regions 207 and 209 and the first gates 210. Unreacted metal is removed by, for example, a wet etch, leaving the silicide contacts 277.

Figure 3H:
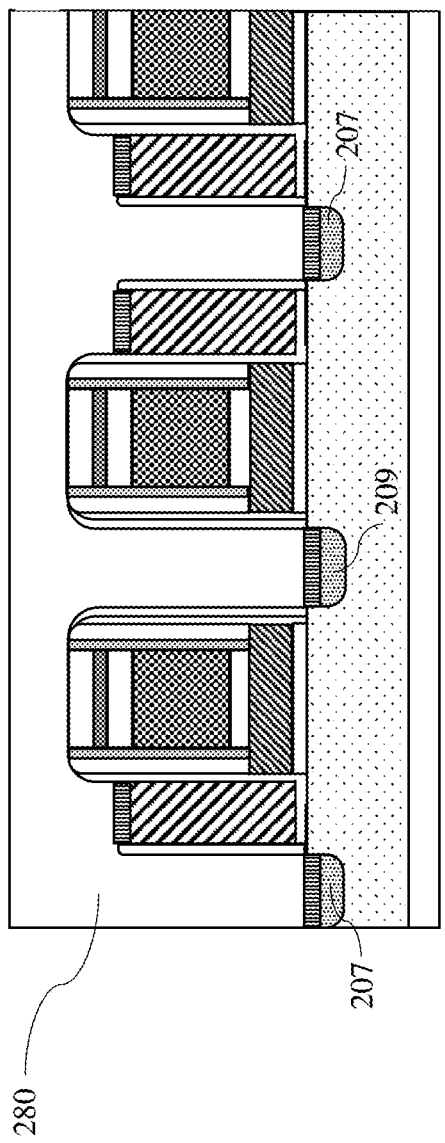

Referring to FIG. 3H, a dielectric layer 280 is formed over the substrate, covering the first and second gates 210 and 220 of the memory cells. The dielectric layer 280, for example, serves as a dielectric layer of an ILD layer. For example, the dielectric layer 280 serves as a pre-metal dielectric (PMD) or CA level of an ILD layer. The dielectric layer 280 may be formed by depositing a dielectric material such as silicon oxide. Providing other types of dielectric materials such as silicon nitride may also be useful. The dielectric layer 280 may be formed by CVD. Other techniques for forming the dielectric layer may also be useful. Excess dielectric material may be removed by planarization, such as by chemical mechanical polishing to form a planar top surface, in a non-limiting example. Other techniques may also be useful.

Figure 3I:
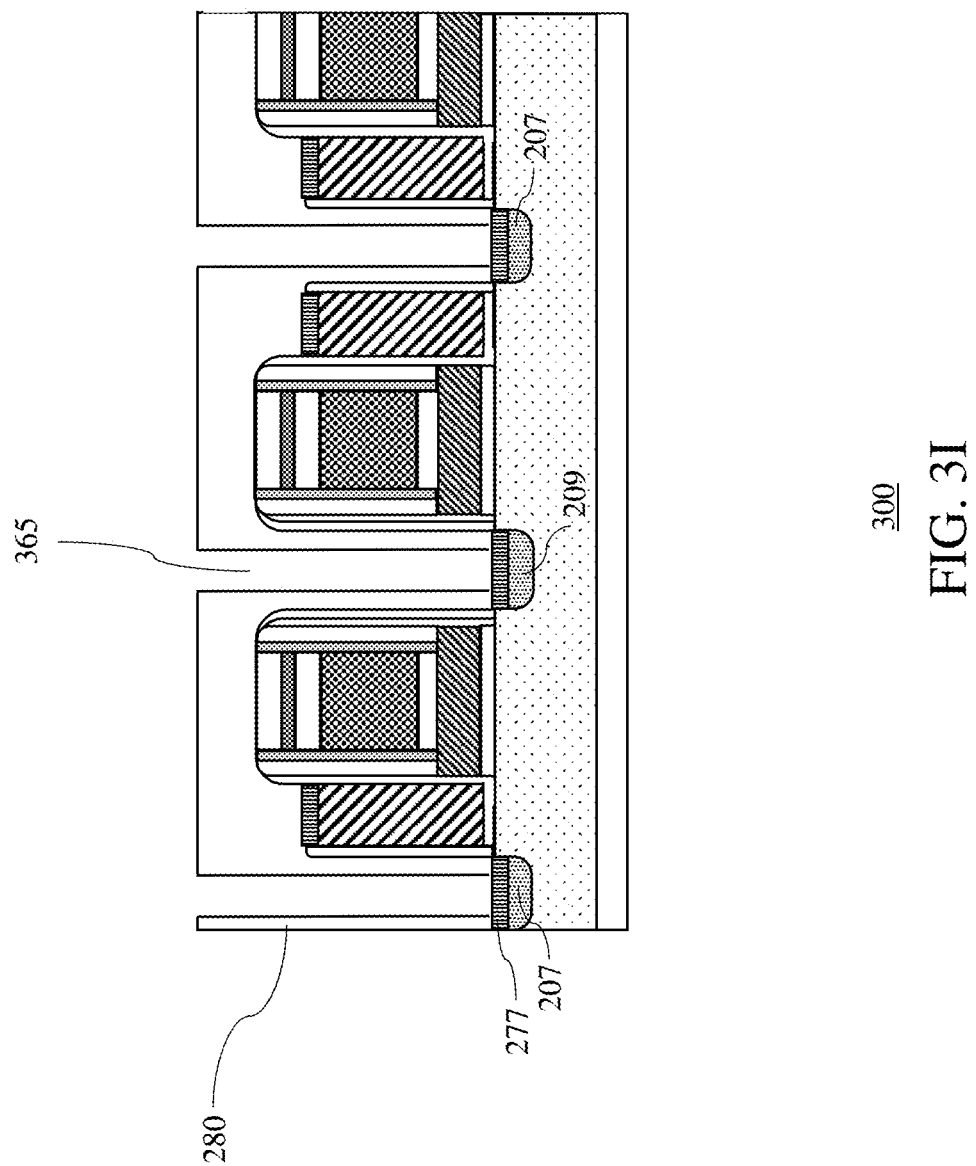

In one embodiment, vias 365 may be formed in the dielectric layer 280 to expose the first and second S/D regions 207 and 209. As illustrated in FIG. 3I, the vias extend through the the dielectric layer 280 from the top surface of the dielectric layer 280 to expose the first and second S/D regions 207 and 209. In the case where silicide contacts 277 are formed over the first and second S/D regions 207 and 209, the silicide contacts 277 on the first and second S/D regions 207 and 209 are exposed. The vias 365 may be formed by mask and etch techniques. After the vias 365 are formed, a conductive material is deposited to fill the vias 365. The conductive material may be tungsten in a non-limiting example. Other types of conductive materials may also be useful. The conductive material may be formed by, for example, plating, such as electro or electro-less plating. Other types of conductive layers or forming techniques may also be useful. A planarization process, such as CMP, is performed to remove excess conductive material, forming first and second S/D contacts 287 and 289 in the dielectric layer 280.

Figure 3J:
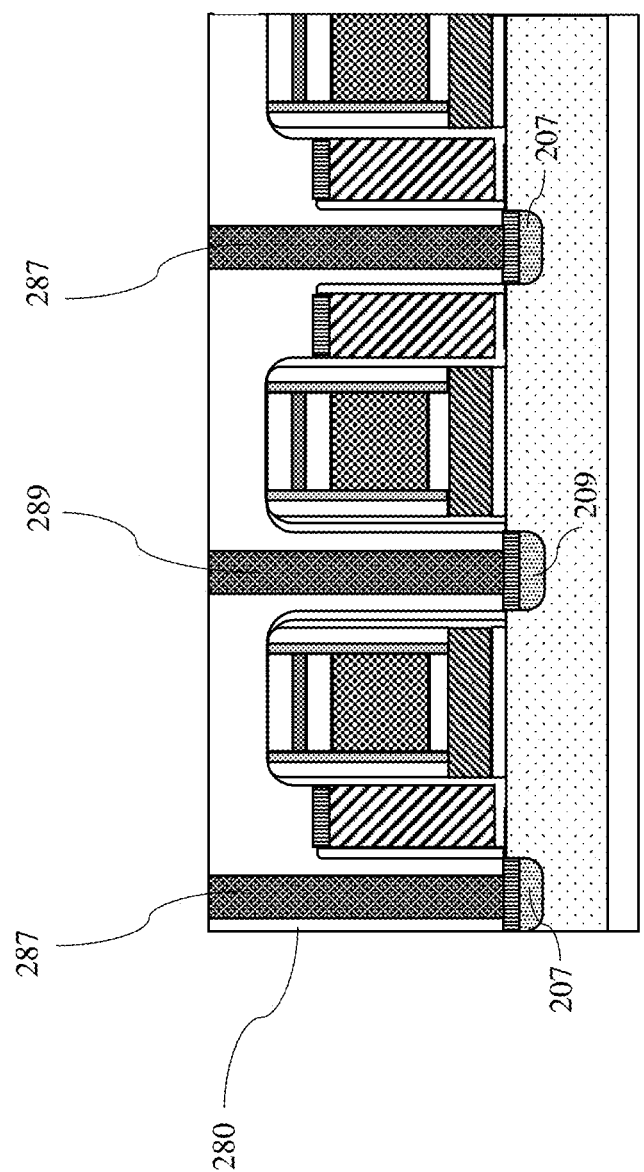

As illustrated in FIG. 3J, the first S/D contacts 287 are coupled to the first S/D region 207, while the second S/D contacts 289 are coupled to the second S/D region 209. The process continues to form a first metal level M1 as well as additional interconnect levels (e.g, via level V1, metal level M2, via level V2, metal level M3) of the ILD layer. For example, a second dielectric layer of the ILD layer is formed over the substrate, covering the dielectric layer 280. The second dielectric layer, for example, serves as a metal level, such as the first metal level M1 of the ILD layer. The dielectric layer, for example, is a silicon oxide layer. Other types of dielectric layers may also be useful. The dielectric layer may be formed by CVD. Other techniques for forming the dielectric layer may also be useful.

Conductive or metal lines may be formed in the metal level. The process continues to form additional via levels and metal levels of the ILD layer. The ILD may include interconnects in a plurality of ILD layers. For example, the ILD layer includes a plurality of ILD or interconnect levels. An ILD level includes a metal dielectric level over a contact dielectric level.

Source lines (SLs) and bit lines (BLs) may be formed in the metal levels of the ILD layer. In a non-limiting example, the BLs and SLs may be formed in metal level M2 of the ILD layer. The BLs and SLs may be formed in the same deposition step. In the case the BLs and SLs are formed in metal level M2, the BLs and SLs are coupled to the first S/D contacts 287 and the second S/D contacts 289 in the PMD (or CA) level through metal level M1 and via level V1. Forming the BLs and SLs in different deposition steps may also be useful. The SLs and BLs may be formed in any metal level of the ILD layer. In other examples, the SLs and BLs may be formed in different metal levels of the ILD layer. The BLs and SLs may be coupled to the first and second S/D regions of the memory cells via the first and second S/D contacts 287 and 289. For example, a first S/D region 207 may be coupled to a SL or a BL via a first S/D contact 287, while a second S/D region 209 may be coupled to a SL or a BL via a second S/D contact 289. For example, in the case the first S/D region 207 is drain region and the second S/D region 209 is a source region, the drain region 207 may be coupled to a BL via the first S/D contact 287 and the source region 209 may be coupled to a SL via the second S/D contact 289.

Additional processes may be performed to complete forming the device. For example, the processes may include forming additional ILD levels, pad level, passivation level, pad opening, dicing, assembly and testing. Other types of processes may also be performed.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate defined with a memory cell region;
   at least one memory cell over the substrate, the at least one memory cell comprising:
      a source region and a drain region in the substrate,
      a first gate and a second gate over the substrate, wherein the first and second gates are arranged between the source region and the drain region, wherein the first gate is arranged between the drain region and the second gate, wherein the first gate and the second gate are separated by an intergate dielectric, wherein the first gate is configured as a select gate and erase gate of the at least one memory cell, and the second gate is configured as a storage gate of the at least one memory cell, wherein the second gate comprises a floating gate and a control gate over the floating gate;
      a second drain region in the substrate, wherein a third gate and a fourth gate are arranged between the source region and the second drain region, wherein the third gate is configured as a second select gate and second erase gate of the at least one memory cell, and the fourth gate is configured as a second storage gate of the at least one memory cell, wherein the fourth gate comprises a second floating gate and a second control gate over the second floating gate; and source/drain (S/D) contacts extending from the source region and the drain region, wherein the source region and the drain region are coupled to either one of a source line (SL) and a bit line (BL) through the S/D contacts.

2. The device of claim 1, wherein the floating gate is separated from the substrate by a tunneling dielectric, and wherein bias voltages applied to the SL, BL, control gate, and first gate triggers electron tunneling from a channel in the substrate beneath the floating gate through the tunneling dielectric to the floating gate during programming operations, and electron tunneling from the floating gate through the intergate dielectric to the first gate during erase operations.

3. The device of claim 2, further comprising a doped well in the substrate, and wherein during programming operations, the control gate is biased at a positive voltage, the BL and WL are biased 0 V, and the SL and doped well are biased at a negative voltage to trigger electron tunneling from the channel region beneath the floating gate through the tunneling dielectric to the floating gate.

4. The device of claim 2, wherein the SL is biased at about −5V to −3V during programming operations.

5. The device of claim 2, wherein the at least one memory cell further comprises a doped well disposed in the substrate, wherein the doped well is biased at a negative voltage during programming operations.

6. The device of claim 2, wherein the first gate is coupled to a wordline (WL) and the control gate is coupled to a control gate line (CG).

7. The device of claim 2, wherein the SL is configured to be parallel to the BL.

8. The device of claim 7, wherein:
the at least one memory cell comprises a plurality of memory cells, the memory cells are arranged in rows and columns to form a memory array;
the memory cells are interconnected by control gate lines (CGs) coupled to control gates and wordlines (WLs) coupled to first gates, the CGLs and WLs are arranged in a row direction; and
the memory cells are interconnected by source lines (SLs) coupled to source regions and bitlines (BLs) coupled to drain regions, the SLs and BLs are arranged in a column direction.

9. The device of claim 7, wherein a pair of memory cells in a column share a common source region and are coupled to a common SL.

10. The device of claim 1, wherein the third gate is arranged between the second drain region and the fourth gate.

11. A method of operating a device, the device comprising at least one memory cell over a substrate, the memory cell having a source region and a drain region in the substrate, a first gate and a second gate over the substrate, wherein the first gate and the second gate are arranged between the source region and the drain region, wherein the first gate is arranged between the drain region and the second gate, wherein the first gate and the second gate are separated by an intergate dielectric, wherein the first gate is configured as a select gate and erase gate of the at least one memory cell, and the second gate is configured as a storage gate of the at least one memory cell, wherein the second gate comprises a floating gate and a control gate over the floating gate, wherein the floating gate is separated from the substrate by a tunneling dielectric, a second drain region in the substrate, wherein a third gate and a fourth gate are arranged between the source region and the second drain region, wherein the third gate is configured as a second select gate and second erase gate of the at least one memory cell, and the fourth gate is configured as a second storage gate of the at least one memory cell, wherein the fourth gate comprises a second floating gate and a second control gate over the second floating gate, source/drain (S/D) contacts extending from the source and drain regions, the source region and the drain region are coupled to either one of a source line (SL) and a bit line (BL) through the S/D contacts, the first gate is coupled to a wordline (WL) and the control gate is coupled to a control gate line (CG), the method comprising:
applying biasing voltages to the SL, BL, CG, and WL to trigger electron tunneling from a channel in the substrate beneath the floating gate through the tunneling dielectric to the floating gate during programming operations, and electron tunneling from the floating gate through the intergate dielectric to the first gate during erase operations.

12. The method of claim 11, wherein the substrate further comprises a doped well, and further comprising biasing the CG at a high positive voltage, the BL and WL at a low voltage, and the SL and doped well at a negative voltage to trigger electron tunneling from the channel region beneath the floating gate through the tunneling dielectric to the floating gate during programming operations.

13. A method of forming a device, comprising:
providing a substrate; and
arranging at least one memory cell over the substrate, wherein arranging the at least one memory cell comprises:
forming a source region and a drain region in the substrate, and
arranging a first gate and a second gate over the substrate, wherein the first gate and the second gate are arranged between the source region and the drain region, wherein the first gate is arranged between the drain region and the second gate, wherein the first gate and the second gate are separated by an intergate dielectric, wherein the first gate is configured as a select gate and erase gate of the at least one memory cell, and the second gate is configured as a storage gate of the at least one memory cell, wherein the second gate comprises a floating gate and a control gate over the floating gate,
forming a second drain region in the substrate and arranging a third gate and a fourth gate between the source region and the second drain region; wherein the third gate is configured as a second select gate and a second erase gate of the at least one memory cell, and the fourth gate is configured as a second storage gate of the at least one memory cell, wherein the fourth gate comprises a second floating gate and a second control gate over the second floating gate,
forming source/drain (S/D) contacts over the source region and the drain region, wherein the source region and the drain region are coupled to either one of a source line (SL) and a bit line (BL) through the S/D contacts.

14. The method of claim 13, wherein arranging the first gate over the substrate comprises forming a first gate electrode layer over the substrate and patterning the first gate electrode layer to remove at least a portion of the first gate electrode layer from a side of the second gate opposite to a side where the first gate is arranged.

15. The method of claim 14,
further comprising forming a dielectric layer over the substrate; and
wherein forming the S/D contacts comprises patterning the dielectric layer to form vias to expose the source region and the drain region and depositing contact material in the vias.

16. The method of claim 13, wherein the third gate is arranged between the second drain region and the fourth gate.

17. The device of claim 1, wherein a portion of the first gate overlaps a top surface of the floating gate.

\* \* \* \* \*